United States Patent [19]
Chrysostomides et al.

[11] Patent Number: 5,646,434
[45] Date of Patent: Jul. 8, 1997

[54] SEMICONDUCTOR COMPONENT WITH PROTECTIVE STRUCTURE FOR PROTECTING AGAINST ELECTROSTATIC DISCHARGE

[75] Inventors: Ioannis Chrysostomides, Munich; Xaver Guggenmos, Dachau; Wolfgang Nikutta, Munich; Werner Reczek, Ottobrunn; Johann Rieger, Zell; Johannes Stecker; Hartmud Terletzki, both of Munich, all of Germany

[73] Assignee: Siemens Aktiengesellschaft, Munich, Germany

[21] Appl. No.: 610,523

[22] Filed: Mar. 4, 1996

[30] Foreign Application Priority Data

Mar. 2, 1995 [DE] Germany ............... 195 07 313.4

[51] Int. Cl.[6] ............................................. H01L 23/62
[52] U.S. Cl. ........................... 257/355; 257/173; 257/363
[58] Field of Search ............................. 257/355, 356, 257/357, 173, 363

[56] References Cited

U.S. PATENT DOCUMENTS

| | | |
|---|---|---|
| 4,855,863 | 8/1989 | Yoshitaki . |
| 5,079,608 | 1/1992 | Wodarczyk et al. . |
| 5,180,932 | 1/1993 | Sengel . |
| 5,426,323 | 6/1995 | Reczek et al. . |
| 5,521,415 | 5/1996 | Kondo .................................. 257/355 |
| 5,568,345 | 10/1996 | Maudd et al. . |
| 5,581,104 | 12/1996 | Lowey et al. ...................... 257/355 |

FOREIGN PATENT DOCUMENTS

| | | |
|---|---|---|
| 0255125A2 | 2/1988 | European Pat. Off. . |
| 0623958A1 | 11/1994 | European Pat. Off. . |
| 2286287 | 8/1995 | United Kingdom . |

Primary Examiner—Mahshid D. Saadat
Assistant Examiner—S. V. Clark
Attorney, Agent, or Firm—Herbert L. Lerner; Laurence A. Greenber

[57] ABSTRACT

A semiconductor component includes a semiconductor body having a terminal pad, a semiconductor function element, and an electrically conductive connecting line connecting the terminal pad to the semiconductor function element. A protective element for protecting against electrostatic discharge is connected between the terminal pad and the semiconductor function element. A first supply line for a first supply potential is connected to the semiconductor function element. A second supply line for the first supply potential is connected to the protective element and is electrically conductively connected to the first supply line. A clamp element is connected to the connecting line and to the first supply line, for limiting a voltage applied to the clamp element to a clamp value.

11 Claims, 2 Drawing Sheets

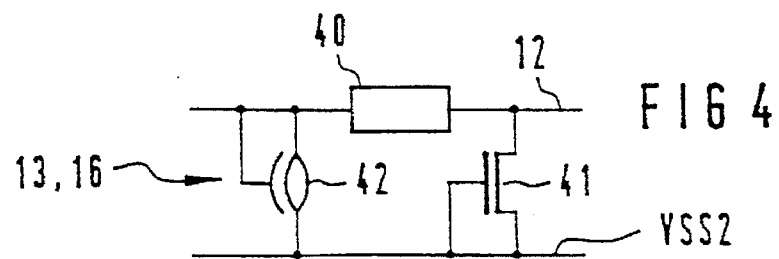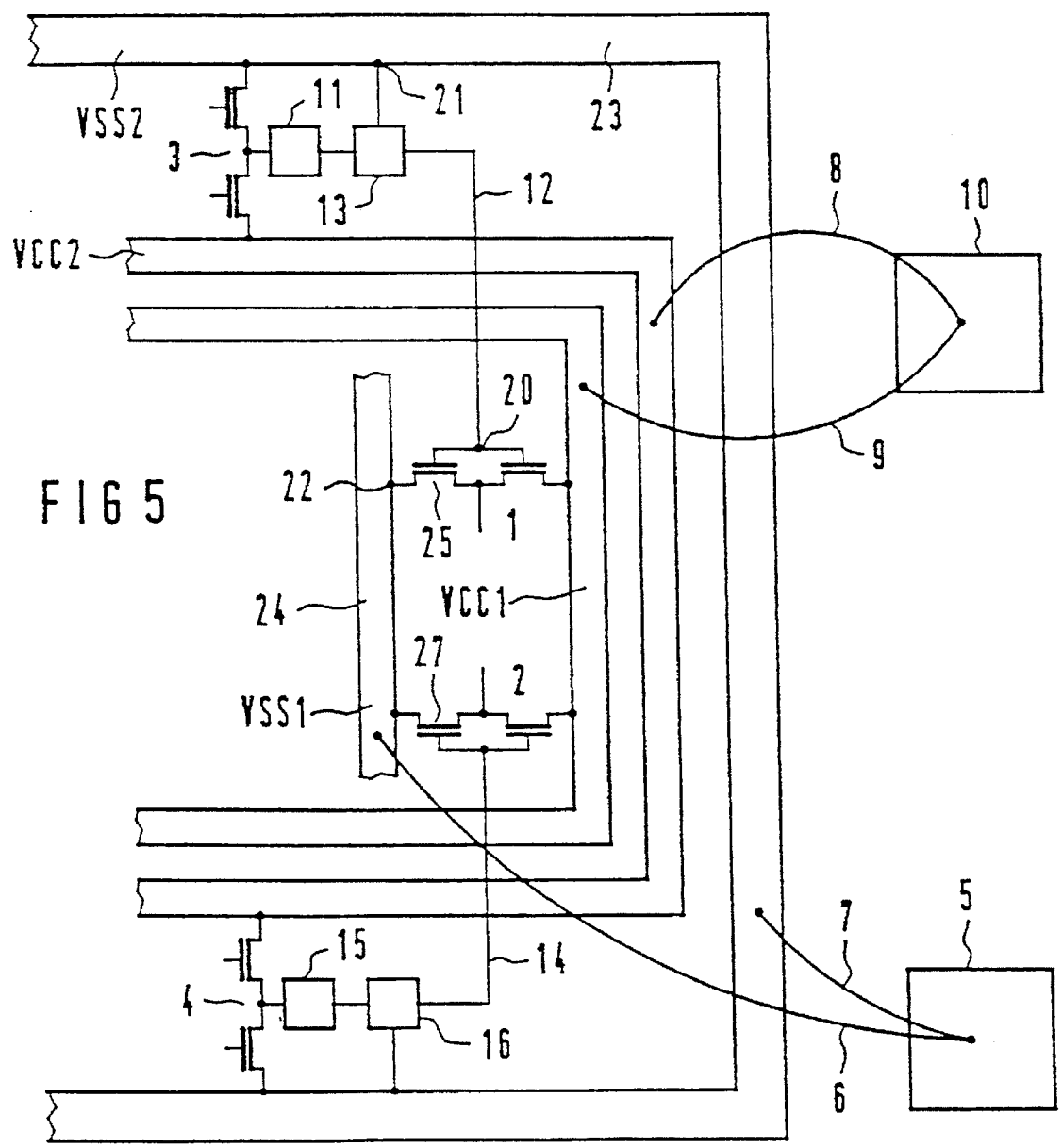

5,646,434

SEMICONDUCTOR COMPONENT WITH PROTECTIVE STRUCTURE FOR PROTECTING AGAINST ELECTROSTATIC DISCHARGE

BACKGROUND OF THE INVENTION

Field of the Invention

The invention relates to a semiconductor component having a semiconductor body with a terminal pad being connected through an electrically conductive connecting line to a semiconductor function element; a protective element for protecting against electrostatic discharge being connected between the terminal pad and the semiconductor function element; a first supply line for a first supply potential being connected to the semiconductor function element; and a second supply line for the first supply potential being connected to the protective element and being electrically conductively connected to the first supply line.

In semiconductor chips, it is well known for various circuit elements contained in the chip to be supplied with voltage from mutually separate supply lines. That serves the purpose of decoupling the various circuit elements from one another in such a way that fluctuations in the supply voltage, which can be caused, for instance, by switching events, are not coupled into other circuit elements. That provision is employed in large scale integrated semiconductor memories, for instance, in order to separate the voltage supply for driver stages from the voltage supply for the other circuit elements, in particular input buffers. The driver stages are known to draw a relatively high current from the supply voltage, so that because of the not insignificant path resistances and parasitic inductances and capacitances of the supply paths, the supply voltage is briefly reduced during such a current pulse.

Such semiconductor chips also include protective circuits for protecting the inputs or outputs against electrostatic overvoltages and resultant electrostatic discharges (electrostatic discharge (ESD) protective elements). Those elements are connected between the input pad of the integrated circuit and the input or output terminal to be protected, and they assure that when an overvoltage is applied the protective element switches through, and the overvoltage pulse is diverted to a supply voltage conductor track.

In the known semiconductor circuits, the input protective structure is provided in the spatial vicinity of the terminal pad. The terminal pad in turn, because of the relatively high current to be driven, is disposed in the vicinity of the output driver. Consequently, the input protective structure is connected to the supply line from which the output driver is supplied. In general, the connecting line between the protective element and the circuit input has a different line length from the connection between the terminal on the supply potential side of the ESD protective element and the terminal toward the supply potential of the input stage. That connection can certainly include bond connections and terminal pins. In practical cases, the line length for the input signal line is on the order of magnitude of about 1 mm, while the line length through the supply potential path is on the order of magnitude of 10 mm. The path resistance of the path toward the supply potential of the connection between the ESD protective element and the input stage, along with its inductance and its parasitic capacitive effect, are no longer negligible. As a result, the diversion of a voltage pulse in the path toward the supply potential causes a voltage drop. The voltage pulse is consequently not completely dissipated by the ESD protective element. The residual voltage pulse remaining after the ESD protective element then is propagated along the input signal line substantially faster than along the relatively long path of the supply lines that is under the influence of the parasitic elements. As a result, the allowable limit value of the voltage applied to the input stage between the input signal terminal and the supply potential terminal is exceeded, and the circuit element located there is destroyed.

SUMMARY OF THE INVENTION

It is accordingly an object of the invention to provide a semiconductor component with a protective structure for protecting against electrostatic discharge, which overcomes the hereinafore-mentioned disadvantages of the heretofore-known devices of this general type in such a way that resistance to electrostatic discharges is increased.

With the foregoing and other objects in view there is provided, in accordance with the invention, a semiconductor component, comprising a semiconductor body having a terminal pad, a semiconductor function element, and an electrically conductive connecting line connecting the terminal pad to the semiconductor function element; a protective element for protecting against electrostatic discharge, being connected between the terminal pad and the semiconductor function element; a first supply line for a first supply potential, being connected to the semiconductor function element; a second supply line for the first supply potential, being connected to the protective element and being electrically conductively connected to the first supply line; and a clamp element being connected to the connecting line and to the first supply line, for limiting a voltage applied to the clamp element to a clamp value.

In the embodiment of the invention, the voltage pulse remaining after the ESD protective element and before the input stage is diverted by the clamp element, so that a residual voltage pulse applied directly to the input stage between the signal input and the supply potential terminal is below the destruction limit of the components of the input stage that are located there.

In accordance with another feature of the invention, there is provided at least one bond connection connecting the first and second supply lines to one another.

In accordance with a further feature of the invention, the semiconductor function element has a terminal, the at least one bond connection has a terminal, the first supply line has a portion disposed between the terminal of the semiconductor function element and the terminal of the at least one bond connection, and the clamp element is connected to the portion of the first supply line.

In accordance with an added feature of the invention, the semiconductor function element is connected to the first supply line and to the connecting line at a given location, and the clamp element has a first terminal connected to the first supply line and a second terminal connected to the connecting line, in the immediate spatial vicinity of the given location.

In accordance with an additional feature of the invention, the clamp element includes an MOS transistor having a main current path connected to the connecting line and to the first supply line and a gate terminal connected to the first supply line.

In accordance with yet another feature of the invention, the semiconductor body is a diode switched in the depletion direction, which is operated at breakdown in the event of an overvoltage pulse. Alternatively, a so-called zero voltage transistor can be used, having a gate-to-source path which is connected between the signal line terminal and the supply potential terminal of the input stage and having gate and source terminals that are connected to one another. Any other circuit element that limits the voltage after a voltage threshold is exceeded is also conceivable.

In accordance with yet a further feature of the invention, the connecting line has a given resistance, the protective element includes a resistor connected between the terminal pad and the semiconductor function element, and the resistor has a resistance being adjusted for setting a sum of the resistance of the resistor and the given resistance to a predetermined value.

In accordance with yet an added feature of the invention, there are provided additional protective elements having resistors, additional semiconductor function elements and additional connecting lines respectively connecting the semiconductor function elements to the protective elements and having a given resistance, forming a multiplicity of protective elements, semiconductor function elements and connecting lines, and a sum of the resistance of the resistors and the given resistance is substantially constant for the multiplicity of protective elements, semiconductor function elements and connecting lines.

As mentioned above, the ESD protective element typically includes a series resistor. This has until now been dimensioned for the least favorable case of a very short signal line. Therefore, in combination with the invention it is advantageous to dimension the resistance of this series resistor of the ESD protective structure as a function of the line length connected to that structure, so that the sum of the values of the line resistance and the series resistance of the protective element remains approximately constant for various line lengths. This means that for long signal line lengths, the series resistance of the ESD protective element should be reduced accordingly. Therefore, the signal propagation time along a long signal line decreases as well, so that over all the access speed of the component is increased. The signal propagation along all of the signal lines is then approximately constant.

In accordance with yet an additional feature of the invention, the protective element includes a field oxide transistor having a main current path connected between the terminal pad and the second supply line and a gate terminal connected to the terminal pad.

In accordance with a concomitant feature of the invention, the semiconductor function element is an input switching stage, and there is provided an output driver stage being connected to the terminal pad and to the second supply line.

Other features which are considered as characteristic for the invention are set forth in the appended claims.

Although the invention is illustrated and described herein as embodied in a semiconductor component with a protective structure for protecting against electrostatic discharge, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a schematic and block circuit diagram of an exemplary embodiment of an ESD protective structure; and FIG. 5 is a schematic and block circuit diagram with a basic diagrammatic plan view of a layout of a semiconductor component.

DESCRIPTION OF THE PREFERRED EMBODIMENTS

Figure 1:
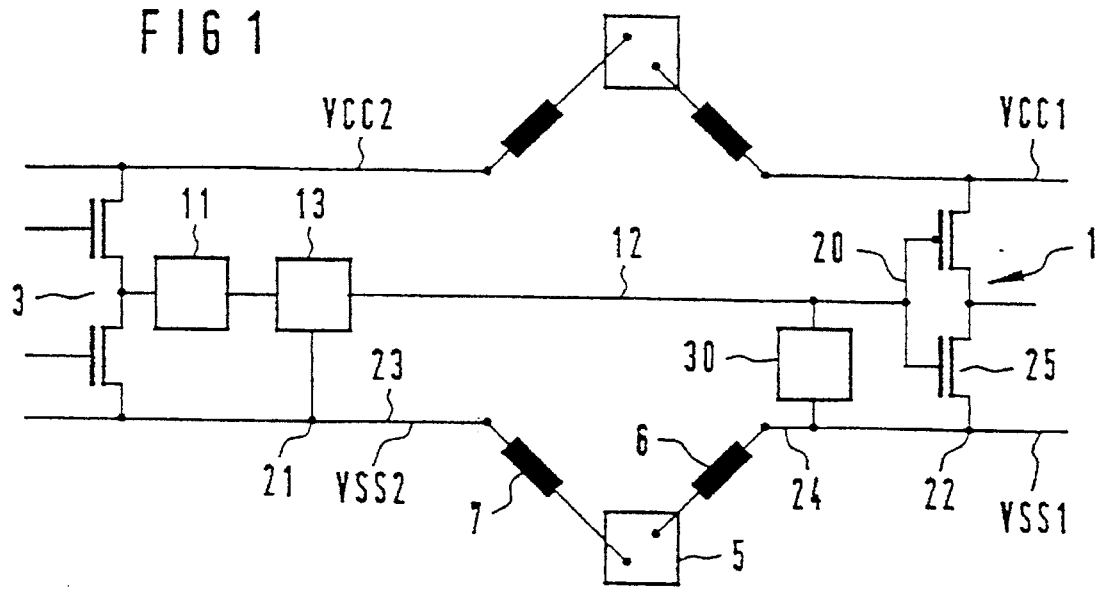
FIG. 1 is a schematic and block electric substitute circuit diagram of a portion of a semiconductor component which is relevant to the invention.

Referring now to the figures of the drawing in detail and first, particularly, to FIG. 5 thereof, there is seen a semiconductor component in which first supply lines VSS1, VCC1 are provided with supply potentials for supplying function elements in the form of input stages 1, 2 of an integrated circuit. The supply potential on the supply line VSS1 is the supply potential toward ground, and the supply potential on the supply line VCC1 is the supply potential that is positive as compared with ground. In order to supply output drivers 3, 4, one further supply line VSS2, VCC2 is provided for each of the two supply potentials. The supply lines VSS1, VSS2 for the ground supply potential are spatially separated from one another and are only electrically connected to one another, so that a supply from the same supply potential source is possible. In order to provide a connection to the supply potential source, a connection pin 5 is provided, which is connected to the supply lines VSS1 and VSS2 through respective bonding wires 6, 7. Correspondingly, the supply lines VCC1, VCC2 are connected through respective bonding wires 8, 9 to a supply pin 10. Instead of a single supply pin for supplying a supply potential, separate supply pins may also be used for the lines VSS1 and VSS2, or VCC1 and VCC2, which are then connected through the conductor tracks of a printed circuit or a pole of the voltage source.

The input switching stage 1 has an input terminal which is connected through a signal line 12 to a terminal pad 11. A protective element 13 for protecting against electrostatic discharges is connected between the terminal pad 11 and the input stage 1. The protective element 13 is connected to the supply line VSS2, so that an overvoltage pulse coupled in at the terminal pad 11 is diverted to ground through the supply line VSS2. The terminal pad 11 is also connected to an output of the output driver 3. The input switching stage 2 is connected through a signal line 14 to a terminal pad 15 in a corresponding way. An ESD protective structure 16 is also provided between the pad 15 and the input stage 2 in the vicinity of the pad. The pad 15 also serves as a terminal pad for the output driver 4.

The length of the signal line 12 between the input protective structure 13 and a terminal 20 of the input stage or buffer 1 is substantially shorter than a line length between a ground terminal 21 and a ground terminal 22 of the input stage 1. The latter line length is in fact composed of a line portion 23 of the supply line or conductor track VSS2, the bonding wires 7, 6, and a portion 24 of the supply line or conductor track VSS1. Various ohmic path resistors and parasitic inductances and capacitances are operative along this electrical connection. In particular, the bonding wires have an inductive effect. Consequently, an overvoltage pulse that is present at the pad 11 is not completely dissipated by the input protective structure 13. Due to the varying signal transit time along the line 12 and along the signal path 23, 7, 6, 24, a voltage which can cause destruction of the gate oxide is present at the gate-to-source path of a transistor 25 of the input stage 1. The situation is correspondingly true for the switching stage 2 with respect to the gate oxide of a transistor 27. Since there the ground connection of the protective structure 16 to the transistor 27 has a shorter line path, the danger of breakdown is somewhat reduced but nevertheless still exists.

An electrical substitute circuit diagram of portions of the layout shown in FIG. 5 which are applicable to the input stage 1, is provided in FIG. 1. Identical elements are assigned the same reference numerals. A semiconductor body 30 is provided in order to limit a residual voltage pulse at the gate oxide of the transistor 25 that remains upon the occurrence of a voltage pulse at the terminal pad 11. Through the use of the semiconductor body 30, the residual voltage which is effective through the gate-to-source path of the MOS transistor 25 is limited, after an electrostatic discharge at the pad 11, to the clamp voltage generated by the semiconductor body 30. It is assured that an excessively high voltage will not be present at the gate oxide. The semiconductor body has a switching threshold for that purpose. If the voltage present at the semiconductor body exceeds the switching threshold, then the semiconductor body becomes conducting, so that the voltage pulse is dissipated to the ground supply line VSS1. The voltage is thus limited to the clamp voltage.

The semiconductor body 30 is suitably connected to the signal line 12 in the immediate vicinity of the input terminal 20 of the input stage or buffer 1. A ground terminal of the semiconductor body 30 is also connected to the supply line VSS1 in the immediate vicinity of the ground terminal 22 of the input stage or buffer 1. In general, the placement of the semiconductor body or element 30 and its terminals must be carried out in such a way that the signal line 12 in the portion 24 of the supply line or conductor track VSS1 is connected between a terminal of the bonding wire 6 and the ground terminal 22 of the input stage or buffer 1.

Figure 2A:
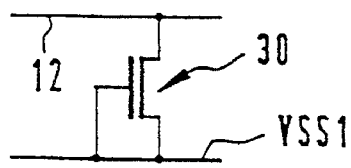
FIGS. 2a and 2b are schematic circuit diagrams of exemplary embodiments of a semiconductor body.
Figure 2B:
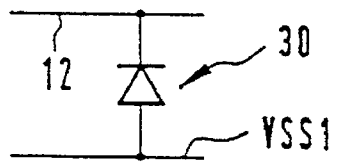

FIGS. 2a and 2b show a circuitry realization of the semiconductor body 30. In FIG. 2a, the semiconductor body or switch element 30 is preferably a so-called zero-volt transistor, having a drain-to-source path which is connected between the signal line 12 and the conductor track VSS1 and having a gate terminal which is likewise connected to the signal line VSS1. In FIG. 2b, the semiconductor body or switch element 30 can alternatively be constructed as a diode as well, which is connected in the depletion direction between the lines 12 and VSS1. This means that the anode terminal of the diode is connected to the ground supply line VSS1, and the cathode terminal is connected to the signal line 12. Upon activation, the diode is operated at breakdown in accordance with FIG. 2b. A corresponding switch element is also connected between the signal line 14 and the connecting line VSS1 in the vicinity of the input stage or buffer 2.

One exemplary embodiment for the protective structures 13, 16 is shown in FIG. 4. The protective structure includes a series resistor 40, which may be provided as a diffusion resistor. A zero-volt transistor 41 is provided on the side of the input stage or buffer in the protective structure. A field oxide transistor 42 is provided toward the pad. A main current path of the field oxide transistor 42 is connected between the signal line 12 and the supply line VSS2. A control terminal of the field oxide transistor 42 is connected to the signal line 12. In a known manner, the control electrode of the field oxide transistor 42 is constructed not in the form of a gate oxide, as in the case of the transistor 41, but rather as a field oxide which is thick in the vertical direction. This field oxide is used in other regions of the semiconductor body as well, among other purposes for surface insulation.

Figure 3:
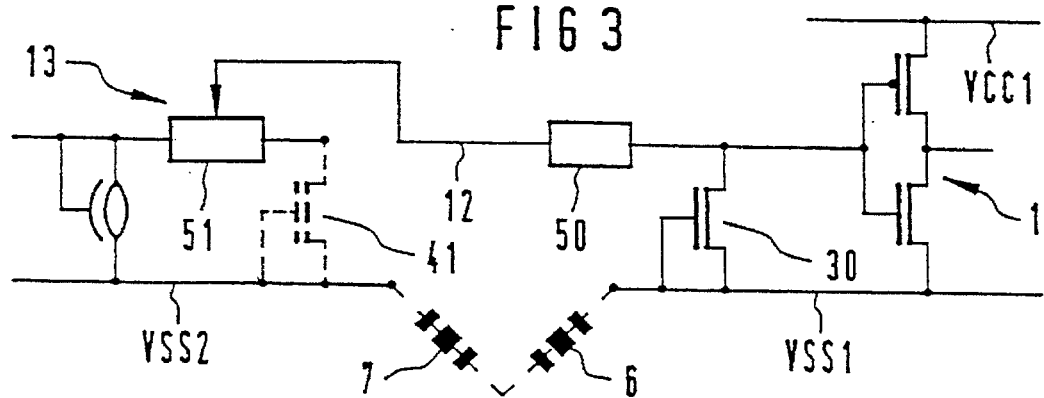
FIG. 3 is a schematic and block circuit diagram of a further feature of the invention with a variable series resistance of an ESD protective structure.

An advantageous further feature of the invention is shown in FIG. 3. A path resistance of the line 12 is symbolically shown in the form of a resistor 50. The resistor 50 has various resistances for various input stages or buffers, because of the various lengths of the signal line 12. The resistance of a series resistor 51 of the protective structure 13 is adjusted upon manufacture in such a way that a sum of the resistance of the series resistor 51 and the resistor 50 is substantially constant in all input stages or buffers. As a result, in all input stages or buffers, despite different signal line lengths 12, the signal propagation along the line 12 is approximately equal. The series resistance picked up from the resistor 51 should accordingly be decreased with increasing length of the line 12. The maximum possible resistance is adapted to the least favorable case, which pertains to the shortest signal line 12. It is assured through the use of the semiconductor body or clamp element 30 that the ESD resistance of the circuit is preserved. The zero-volt transistor 41 can be used optionally for this application.

We claim:

1. A semiconductor component, comprising:
   a semiconductor body having a terminal pad, a semiconductor function element, and an electrically conductive connecting line connecting said terminal pad to said semiconductor function element;
   a protective element for protecting against electrostatic discharge, being connected between said terminal pad and said semiconductor function element;
   a first supply line for a first supply potential, being connected to said semiconductor function element;
   a second supply line for the first supply potential, being connected to said protective element and being electrically conductively connected to said first supply line; and
   a clamp element being connected to said connecting line and to said first supply line, for limiting a voltage applied to said clamp element to a clamp value.

2. The semiconductor component according to claim 1, including at least one bond connection connecting said first and second supply lines to one another.

3. The semiconductor component according to claim 2, wherein said semiconductor function element has a terminal, said at least one bond connection has a terminal, said first supply line has a portion disposed between said terminal of said semiconductor function element and said terminal of said at least one bond connection, and said clamp element is connected to said portion of said first supply line.

4. The semiconductor component according to claim 1, wherein said semiconductor function element is connected to said first supply line and to said connecting line at a given location, and said clamp element has a first terminal connected to said first supply line and a second terminal connected to said connecting line, in the immediate spatial vicinity of said given location.

5. The semiconductor component according to claim 1, wherein said clamp element includes an MOS transistor having a main current path connected to said connecting line and to said first supply line and a gate terminal connected to said first supply line.

6. The semiconductor component according to claim 1, wherein said clamp element is a diode being connected to said connecting line and to said first supply line and being oriented in the depletion direction from said connecting line to said first supply line.

7. The semiconductor component according to claim 1, wherein said connecting line has a given resistance, said protective element includes a resistor connected between said terminal pad and said semiconductor function element, and said resistor has a resistance being adjusted for setting a sum of the resistance of said resistor and the given resistance to a predetermined value.

8. The semiconductor component according to claim 7, including additional protective elements having resistors, additional semiconductor function elements and additional connecting lines respectively connecting said semiconductor function elements to said protective elements and having a given resistance, forming a multiplicity of protective elements, semiconductor function elements and connecting lines, and a sum of the resistance of said resistors and the given resistance is substantially constant for said multiplicity of protective elements, semiconductor function elements and connecting lines.

9. The semiconductor component according to claim 7, wherein said protective element includes a field oxide transistor having a main current path connected between said terminal pad and said second supply line and a gate terminal connected to said terminal pad.

10. The semiconductor component according to claim 8, wherein said protective elements each include a field oxide transistor having a main current path connected between said terminal pad and said second supply line and a gate terminal connected to said terminal pad.

11. The semiconductor component according to claim 1, wherein said semiconductor function element is an input switching stage, and including an output driver stage being connected to said terminal pad and to said second supply line.

\* \* \* \* \*